United States Patent [19]
Yu et al.

[11] Patent Number: 6,132,113
[45] Date of Patent: Oct. 17, 2000

[54] DEVELOPER CUP

[75] Inventors: Cheng-Hung Yu, Kaohsiung; Hsin-Min Lee, Hsinchu; Yung-Chi Wu, Tainan; Hsin-Ting Tsai, Chang-Hua Hsien, all of Taiwan

[73] Assignee: United Integrated Circuits Corp., Hsichu, Taiwan

[21] Appl. No.: 09/306,260

[22] Filed: May 6, 1999

[30] Foreign Application Priority Data

Feb. 5, 1999 [TW] Taiwan .................................. 88101766

[51] Int. Cl.⁷ ...................................................... G03D 5/00
[52] U.S. Cl. .............................................................. 396/611
[58] Field of Search ..................................... 396/611, 627; 118/52, 320, 325, 666, 667, 696, 697, 712; 430/30, 311, 327, 330; 427/8, 240; 437/231; 134/149, 153, 902

[56] References Cited

U.S. PATENT DOCUMENTS

| | | | |
|---|---|---|---|
| 5,626,913 | 5/1997 | Tomoeda et al. | 427/240 |
| 5,945,161 | 8/1999 | Hashimoto et al. | 427/240 |
| 6,012,858 | 1/2000 | Konishi et al. | 396/611 |

*Primary Examiner*—D. Rutledge
*Attorney, Agent, or Firm*—J.C. Patents; Jiawei Huang

[57] ABSTRACT

A developer cup. The developer cup includes a bed. A central spindle is vertically and rotatably coupled to a center of the bed through an end of the central spindle. A chuck is vertically coupled to an end of the central spindle opposite to the bed end. An upper coupling is coupled to the central spindle between the chuck and the bed, wherein the chuck. A lower coupling is moveably coupled to the central spindle between the upper coupling and the bed. The annular cup has an upper wheel and a lower wheel, wherein the upper wheel is aligned with the lower wheel, the upper wheel is coupled to the lower wheel through a plurality of the brackets, and the lower wheel is smaller than the upper wheel.

14 Claims, 9 Drawing Sheets

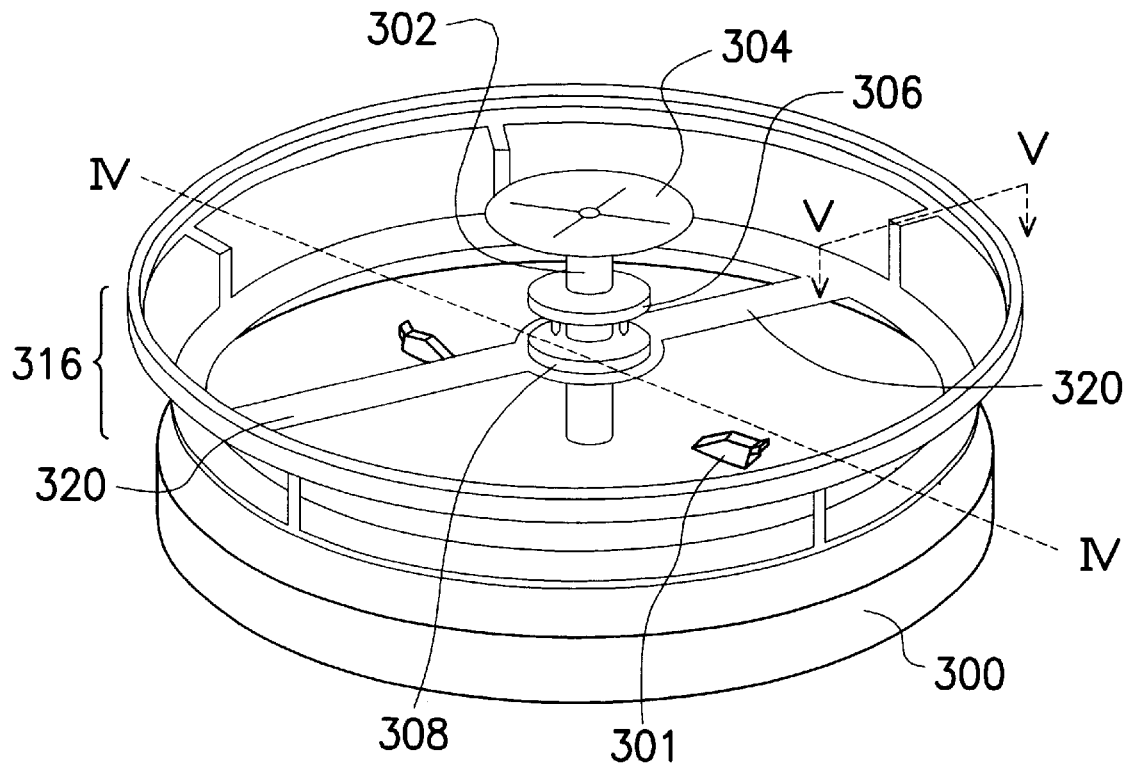
FIG. 3
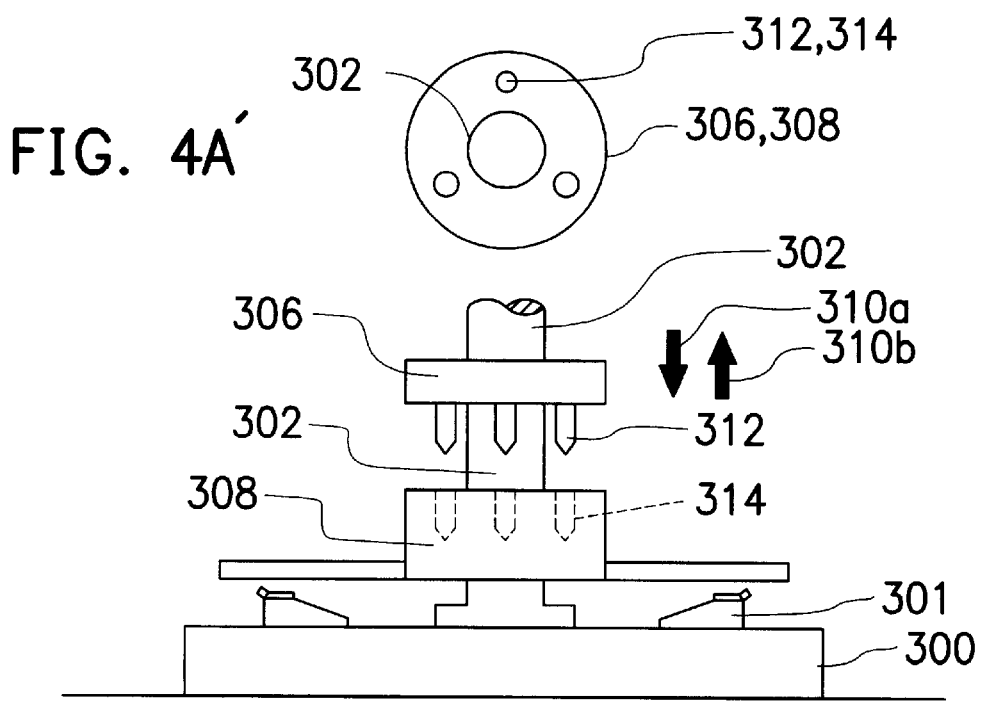
FIG. 4A'
FIG. 4A

DEVELOPER CUP

CROSS-REFERENCE TO RELATED APPLICATION

This application claims the priority benefit of Taiwan application serial no. 88101766, filed Feb. 5, 1999.

BACKGROUND OF THE INVENTION

1. Field of the Invention

The present invention relates to a developer unit. More particularly, the present invention relates to a developer unit having an annular cup.

2. Description of the Related Art

Photolithography is one of the ultimate steps in the semiconductor process. In photolithography, the device or the circuit pattern is coded in the photoresist as regions of exposed and unexposed photoresist. In the development step of photolithography, the exposed or unexposed photoresist is removed by the developer to define the pattern in the photoresist.

In order to perform an in-line photolithography, a commercial development step is performed by a spray/puddle process. Generally, the spray/puddle process comprises three steps. First, the developer is sprayed onto a wafer which is clamped on a vacuumed chuck and rotated. Second, the puddle development process starts with enough developer on the wafer in a static state. Third, the wafer is spun dry after development and wet cleaning.

FIG. 1 is a schematic, cross-sectional view of a conventional developer cup, which is a Mark-8 machine developed by TEL Corporation.

As shown in FIG. 1, a wafer 102 is disposed on a rotatable chuck 100. The wafer 102 can be delivered and carried by the chuck 100 via a mechanical arm. The developer is sprayed onto the wafer 102 from a developer nozzle 104. The wafer 102 and the chuck 100 are rotated with a central spindle 106 as the driving shaft while the developer is sprayed onto the wafer 102, so that the developer is uniformly distributed on the wafer 102. In order to distribute the developer on the wafer 102 evenly and quickly, many kinds of developer nozzles are designed, for example, an E square nozzle is designed. The E square nozzle is a long developer nozzle with a length as same as the diameter of the wafer to increase the sprayed range and the flux of the developer.

After the developer is uniformity sprayed onto the wafer 102, a puddle development processsis performed with the wafer 102 being kept stationary. While the puddle development process is performed, the developer nozzle 104 is removed and a wash-up nozzle 108 is disposed over the wafer 102. After a duration of the development, deionized water (DI water) is sprayed to remove the developer on the wafer 102. The chuck 100 and the wafer 102 are rotated to spin dry the wafer 102 according to a centrifugal force. It is worth noting that underside rinse nozzles 110 and 112 are used to rinse the underside of the wafer 102. During development, a part of the developer flows along a rim of the wafer 102 to the underside thereof. Thus, a guide ring 116 and an external cup 118 are installed to enclose the develop cup to avoid the developer and the de-ionized water to be spilled by the centrifugal force. Furthermore, the effluent can be directed and collected to a collecting tub thereby.

Besides the TEL Mark system model, common developer machines further comprise the ACT Track model and the DNS D-SPIN 200 model, etc. The developer cup structure of the developer machines is similar to that shown in FIG. 1.

FIG. 2 is a schematic, cross-sectional view of a conventional DNS D-SPIN 200 developer cup machine. As shown in FIG. 2, the chuck, the underside rinse nozzle, the underside rinse vat and the cup height adjustment screw of the DNS D-SPIN 200 are respectively denoted by the reference numerals 200, 212, 202 and 208, respectively.

The developer cups used in the above-mentioned developer machine controls a quantity of the developer required for fabrication process by way of adjusting the developing dispense of the developer and rotating the chuck. Additionally, the uniformity of the developer on the wafer is controlled by the developer nozzle, such as the E square nozzle. However, the portions of the developer splashing from the wafer leads to the consumption of the developer while the wafer is rotated. Moreover, when the puddle development process is performed while the wafer is in a static situation, portions of the developer flow away from the wafer or flow onto the underside of the wafer. Therefore, more developer is wasted.

SUMMARY OF THE INVENTION

The invention provides a developer unit. By using the developer unit, the developer does not flow to the underside of the wafer and the minimum developer required for performing the development step can be met by using any kind of the developer nozzle. Additionally, the contaminate remaining on the underside of the wafer can be reduced and the contaminate on the inner wall of the annular cup can be removed.

To achieve these and other advantages and in accordance with the purpose of the invention, as embodied and broadly described herein, the invention provides a developer cup. The developer cup includes a bed, a central spindle, a chuck, an upper coupling, a lower coupling and an annular cup. The central spindle is vertically and rotatably coupled to a center of the bed through an end of the central spindle. The chuck is vertically coupled to an end of the central spindle opposite to the bed end. The upper coupling couples to the central spindle between the chuck and the bed, wherein the chuck, the upper coupling and the bed are coaxial to each other and the chuck, the upper coupling and the bed axially and linearly move synchronously through the central spindle. The lower coupling is moveably coupled to the central spindle between the upper coupling and the bed, wherein the upper coupling is separably coupled to the lower coupling. The annular cup has an upper wheel and a lower wheel, wherein the upper wheel is aligned with the lower wheel and the upper wheel is coupled to the lower wheel through a plurality of brackets and the lower wheel is smaller than the upper wheel.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 3 is a three-dimensional, schematic diagram of a developer cup in a preferred embodiment according to the invention;

The cross-sectional view taken along the line IV—IV in FIG. 3 is denoted as FIG. 4A;

FIG. 4A' is a top view of FIG. 4A.

Figure 1:
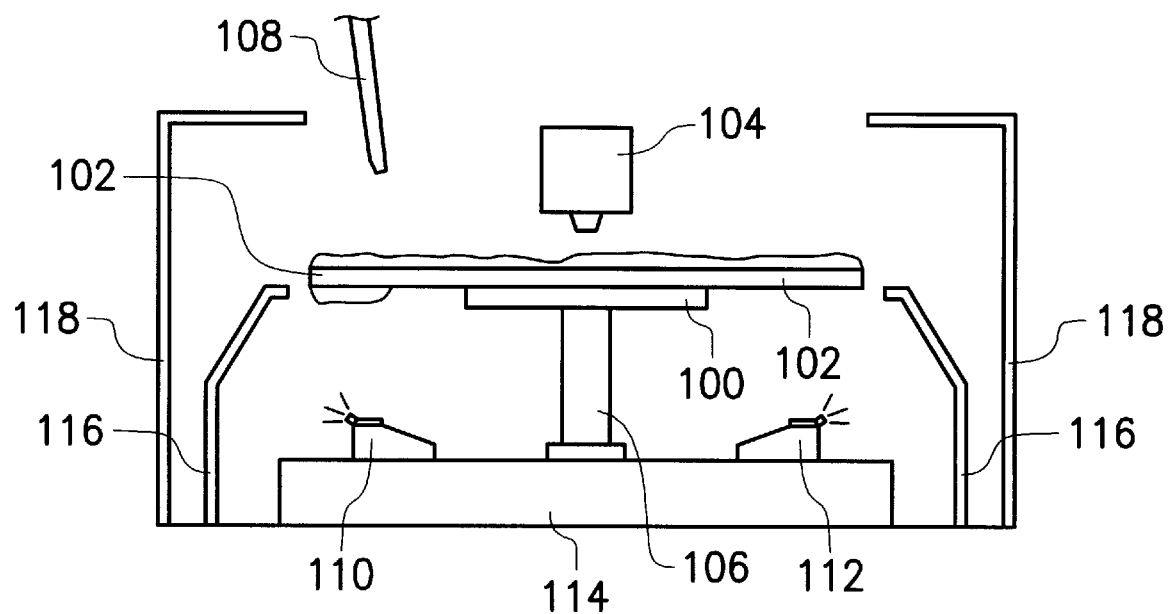
FIG. 1 is a schematic cross-sectional view of a conventional Mark-8 machine developer cup, as developed by TEL Corporation.
Figure 2:
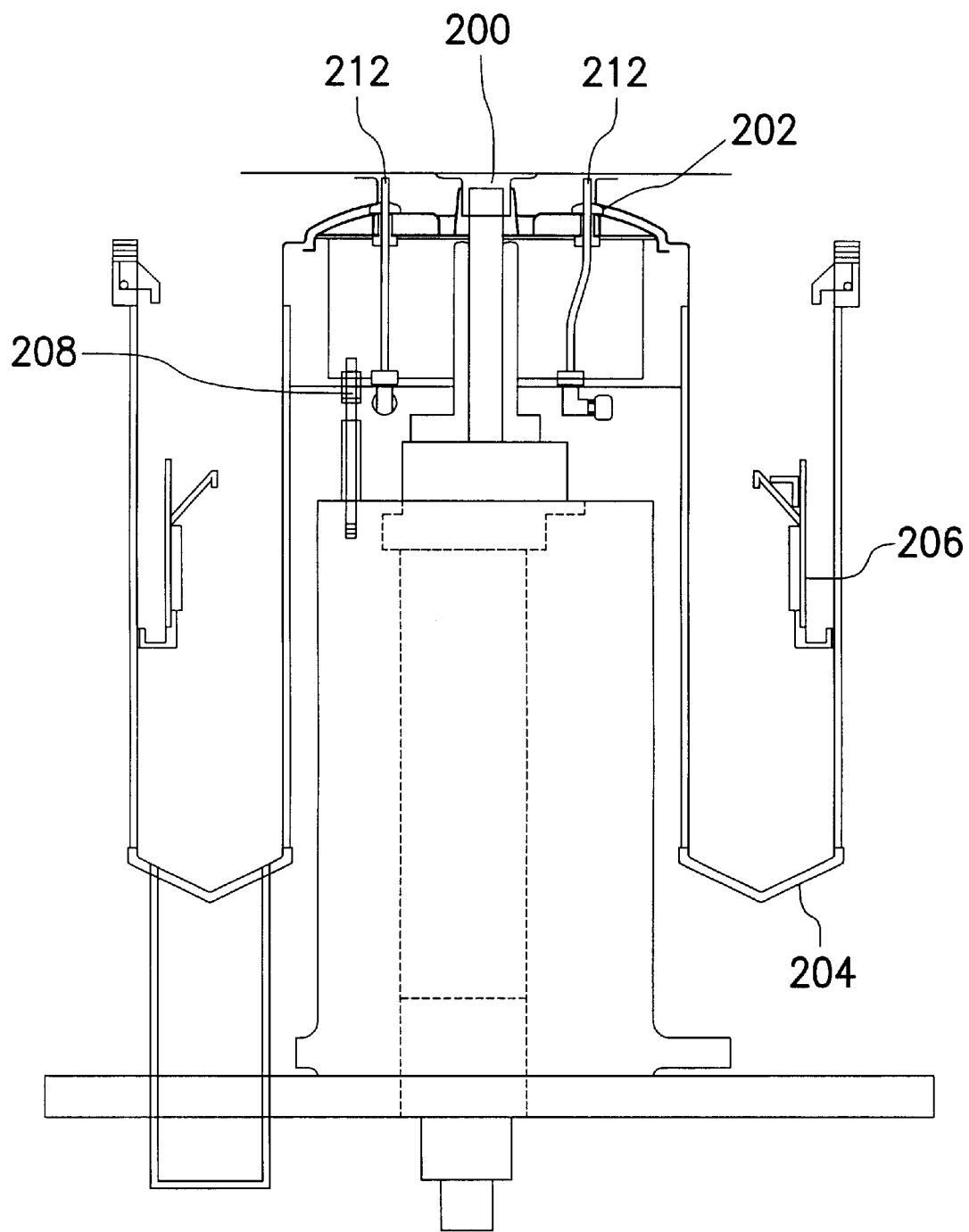
FIG. 2 is a schematic, cross-sectional view of a conventional DNS D-SPIN 200 developing cup machine.
Figure 4B:
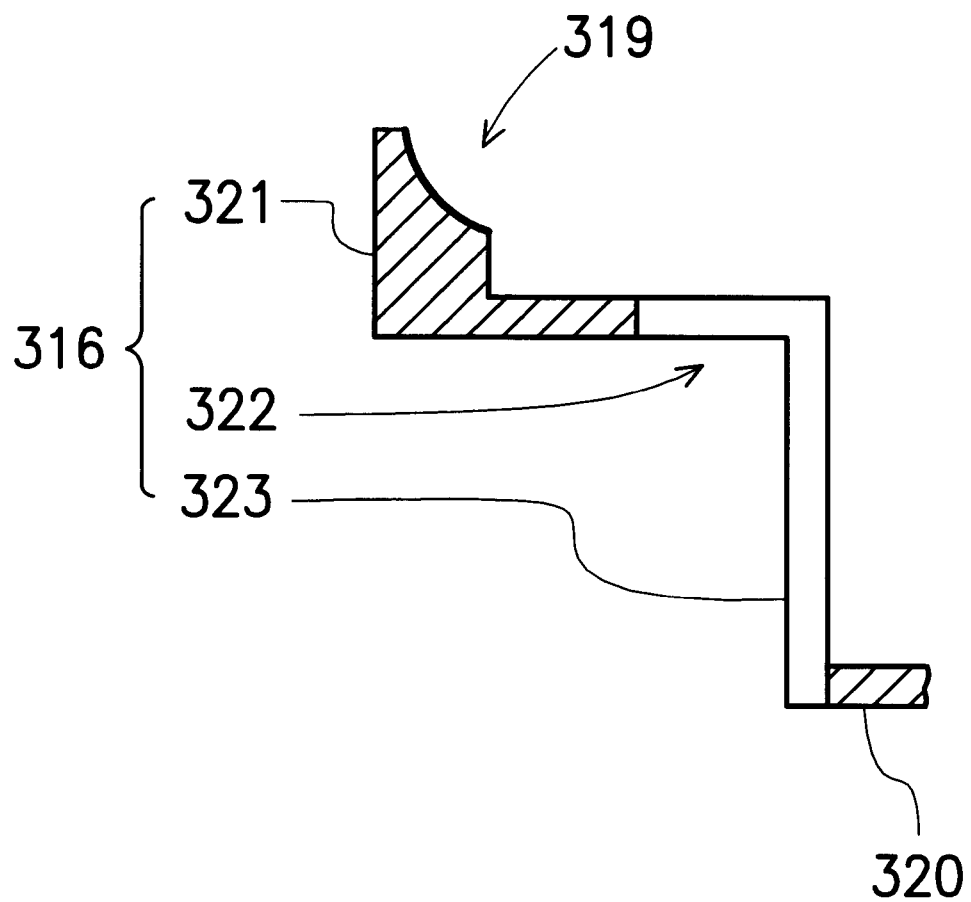

The cross-sectional view taken along the line V—V in FIG. 3 is denoted as FIG. 4B; and FIGS. 5A through 5E are schematic, cross-sectional views of the development step in a developer unit in a preferred embodiment according to the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIG. 3 is a stereogram of a developer cup in a preferred embodiment according to the invention. The cross-sectional view taken along the line IV—IV in FIG. 3 is denoted as FIG. 4A. The cross-sectional view taken along the line V—V in FIG. 3 is denoted as FIG. 4B. FIGS. 5A through 5E are schematic, cross-sectional views of the development step in a developer unit in a preferred embodiment according to the invention.

Referring to FIG. 3 together with FIG. 4A, the developer cup comprises a central spindle 302, a bed 300, several underside rinse nozzles 301 and a chuck 304. One end of the central spindle 302 is vertically and rotatably coupled to the center of the bed 300, wherein the bed 300 has the underside rinse nozzles 301 disposed thereon. The other end of the central spindle 302 is vertically coupled to the chuck 304. The chuck 304 has a surface on which a wafer (not shown) may be placed. Preferably, the surface of the chuck 304 has several holes which are coupled to a vacuum system. The vacuum system can then suck the wafer down onto the chuck 304 surface, where it is securely held.

Between the chuck 304 and the bed 300, there is further an upper coupling 306 and a lower coupling 308. The upper coupling 306 having several pins 312 is coupled to the central spindle 302 and is coaxial to the bed 300, and the upper coupling 306 can coaxially and linearly move synchronously with the bed 300 through the central spindle 302. Preferably, the pins 312 can be plugs or wedges, for example. The lower coupling 308 between the upper coupling 306 and the bed 300 is moveably coupled to the central spindle 302 and is coaxial to the bed 300 and the upper coupling, wherein the lower coupling 308 has several holes 314 which respectively correspond to the pins 312 of the upper coupling 306. The pins 312 of the upper coupling 306 are wedged into the holes 314 of the lower coupling 308 while the upper coupling 306 moves with the chuck 304 in a direction denoted by an arrow 310a. While the upper coupling 306 moves to wedge the lower coupling 308, the bed 300 moves away from the lower coupling 308 in a direction along the arrow 310a. While the upper coupling 306 moves away from the lower coupling 308 in a direction denoted by an arrow 310a, the bed 300 moves to the lower coupling 308 in a direction along to the arrow 310a. Therefore, the lower coupling 308 wedges the bed 300 through wedging the pins (not shown) of the lower coupling 308 into the holes (not shown) of the bed 300. It also can be achieved by wedging the pins (not shown) of the bed 300 into the holes (not shown) of the lower coupling 308.

While the upper coupling 306 wedges the lower coupling 308, the lower coupling 308 is lead to rotate by the upper coupling 306 as the central spindle 302 is rotating. Conversely, while the upper coupling 306 departs from the lower coupling 308, the lower coupling 308 does not rotate by the upper coupling 306 as the central spindle 302 is rotating. The numbers of the pins and the holes can be adjusted according to the needs of the application. In this example, the pins 312 and the holes 314 respectively belong to the upper coupling 306 and the lower coupling 308. In application, the pins and the holes can respectively belong to the lower coupling 308 and the upper coupling 306.

Referring to FIG. 3 together with FIG. 4B, the developer cup also comprises an annular cup 316. The annular cup 316 comprises an upper wheel 321 and a lower wheel 323. The lower coupling 308 is fixed on the lower wheel 323 through two long stands 320, which have equal length, and the lower coupling 308 and the lower wheel 323 are coaxial. In the example, there are two long stands 320 used in the developer cup. In application, there can be more than two long stands. The upper wheel 321 is aligned with the lower wheel 323 and the lower wheel 323 couples to the upper wheel 321 through several inverted brackets 322, wherein the diameter of the lower wheel 323 is smaller than that of the upper wheel 321. The wall of the upper wheel 321 is higher than the thickness of the wafer. The upper wheel 321 further comprises a tapered, bowed structure 319 at the top of the upper wheel 321. The inner diameter of the upper wheel 321 is similar to the diameter of the wafer; hence, the wafer can be disposed in the developer cup.

Figure 5A:
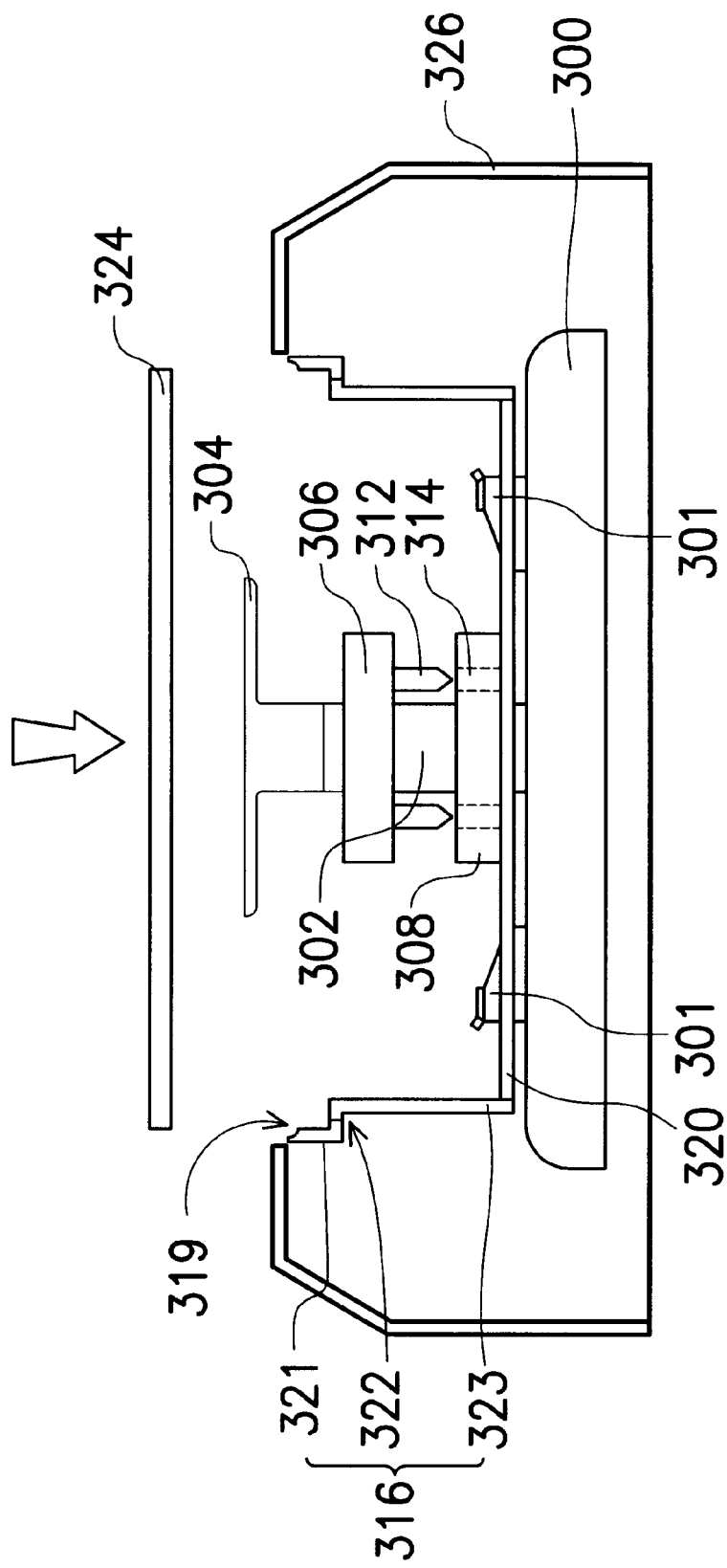

As shown in FIG. 5A, a wafer 324 prepared to be patterned is centrically disposed on the chuck 304 while the upper coupling 306 departs from the lower coupling 308.

Figure 5B:
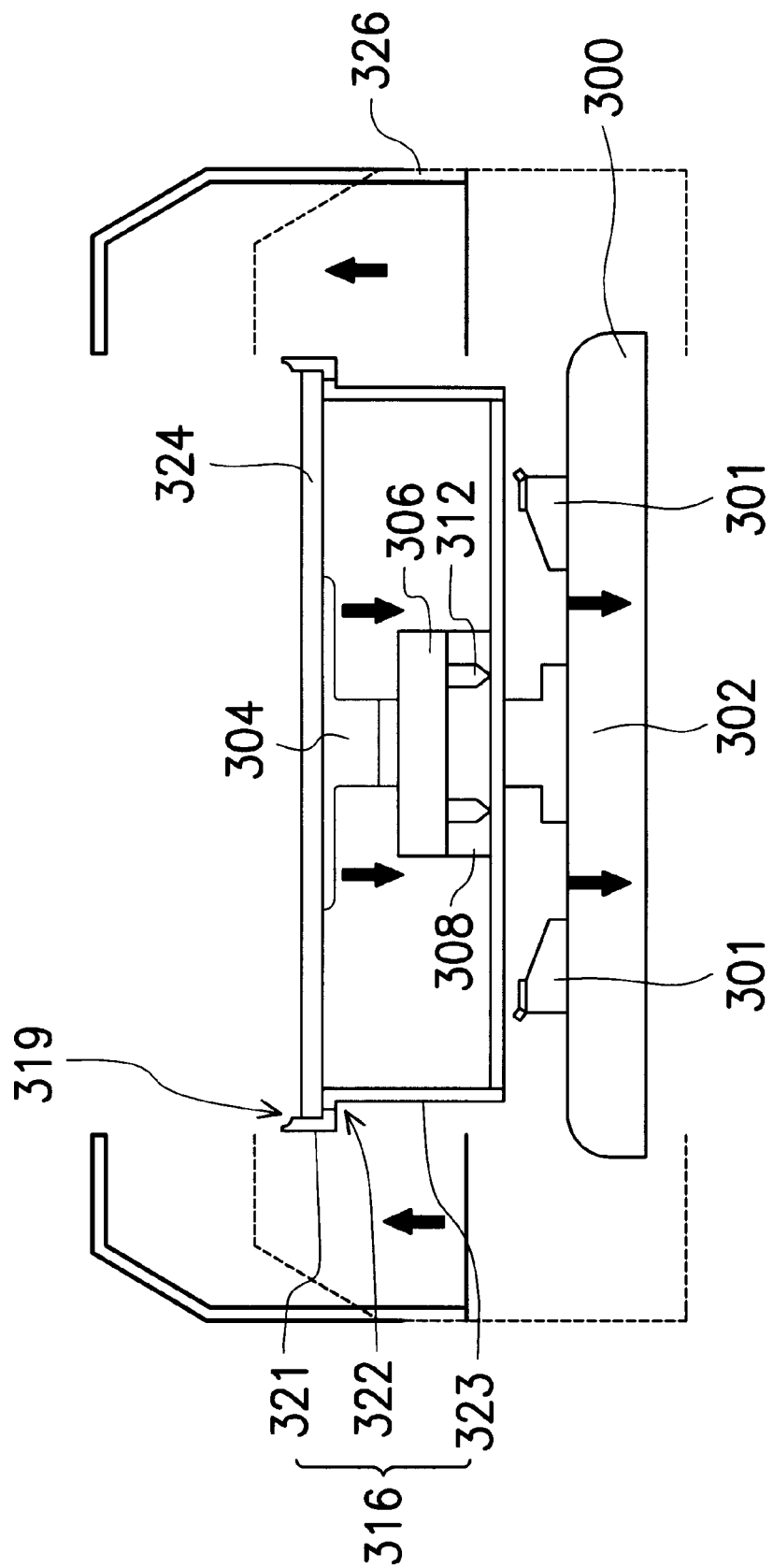

As shown in FIG. 5B, after the wafer 324 is disposed on the chuck 304, the chuck 304 falls down to place the wafer 324 in the annular cup 316 and the edge of the wafer 324 is held on the level saucer of the inverted bracket 322. Simultaneously, the upper coupling 306 wedges the lower coupling 308 and the bed 300 moves away from the lower coupling 308. Therefore, the underside rinse nozzles 301 are lower than the annular cup 316 and the annular cup 316 can rotate without blocking by the underside rinse nozzles 301. Thereafter, the vacuum system (not shown) coupling to the chuck 304 sucks the wafer 324 and the wafer 324 closely contacts the level saucer of the inverted bracket 322. An external cup 326 rises in preparation for the developer spraying step.

Because of the tapered, bowed structure 319 at the top of the upper wheel 321, the wafer 324 can successfully slide to the proper location. Additionally, when the wafer 324 does not slide to the proper location, the vacuum suction cannot reach the required conditions and an abnormal operation signal warns an operator.

Figure 5C:
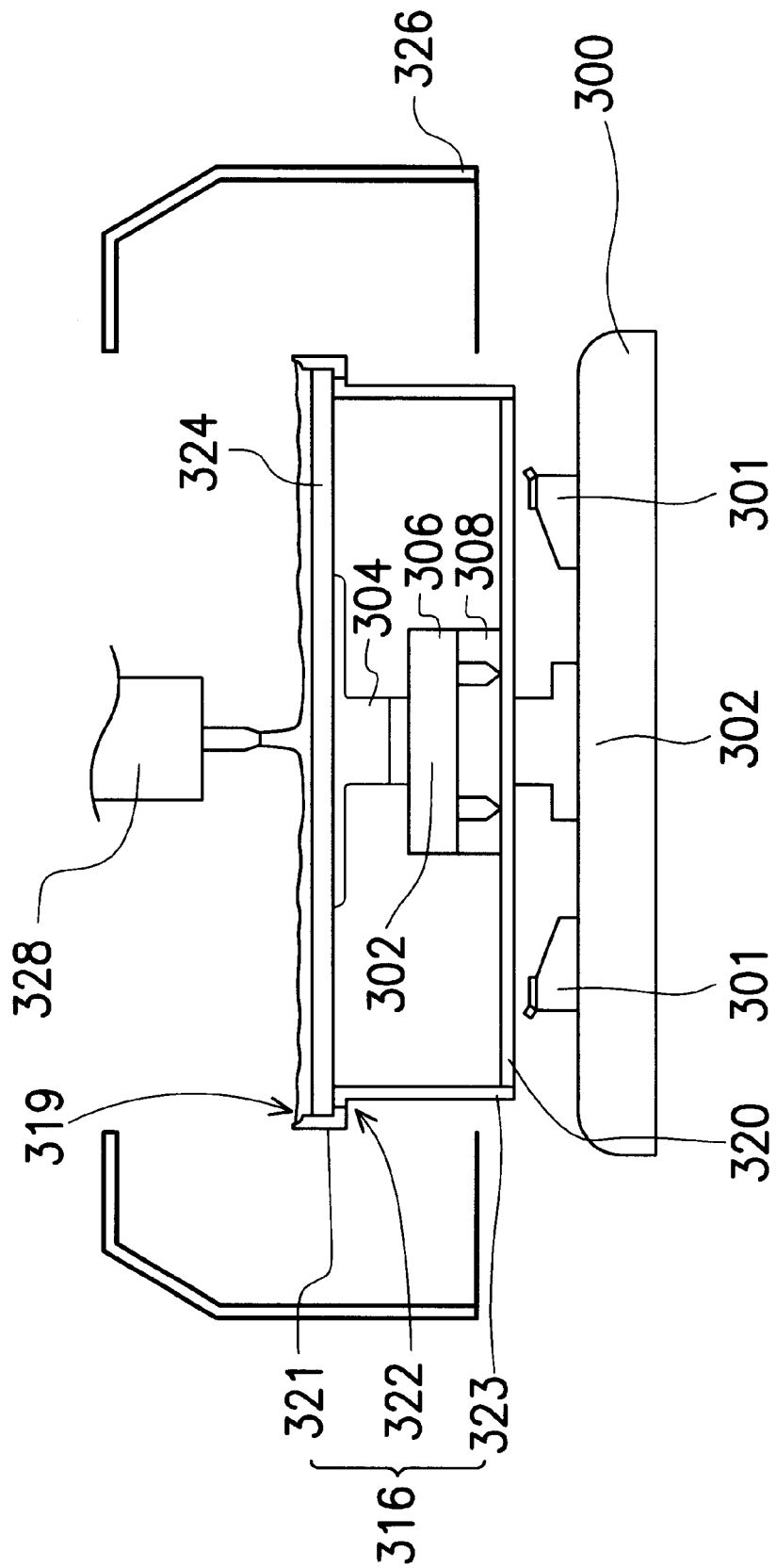

As shown in FIG. 5C, a developer nozzle 328 is disposed over the wafer 324. Adequate developer is sprayed on the wafer 324 by the developer nozzle 328 and, simultaneously, the wafer 324 and the annular cup 316 rotate through the central spindle 302. The developer on the wafer 324 is spread by using a centrifugal effect as the wafer 324 rotates, so that the effect of the minimum developer on the wafer is uniform. Since the wall of the upper wheel 321 is higher than the thickness of the wafer 324, the developer is kept on the wafer in the space surrounded by the upper wheel 321. Therefore, the developer dose not flow to the underside of the wafer 324 and the minimum developer required for performing the development step can be met by using any kind of developer nozzle. After the developer uniformly covers the wafer 324, the wafer 324 is static for performing the puddle development process for a period of time.

Figure 5D:
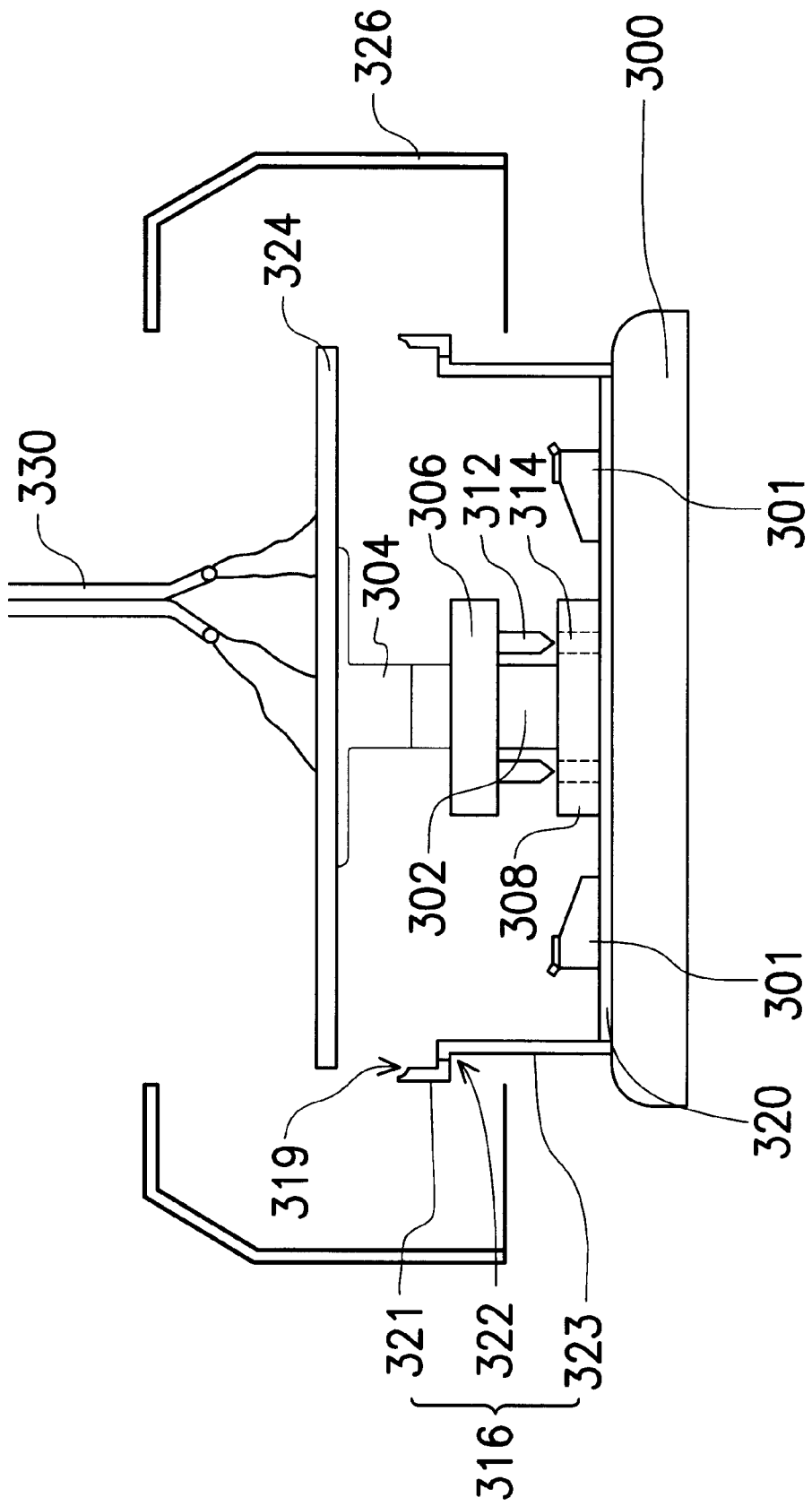

As shown in FIG. 5D, after the puddle development process is performed, the developer nozzle 328 (as shown in FIG. 5C) is removed away from the annular cup 316 and a DI water nozzle 330 is disposed over the wafer 324. The chuck 304 is raised to leave the annular cup 316 and the upper coupling 306 departs from the lower coupling 308. Therefore, the bed 300 is also raised and the underside rinse nozzles 301 are exposed in the annular cup 316. The DI water nozzle 330 and the underside rinse nozzles 301 spray DI water to the wafer 324, which is rotating. Hence, both sides of the wafer 324 can be uniformly washed by DI water. At the same time, the inner wall of the annular cup 316 can be washed by DI water sprayed from the underside rinse nozzles 301. The DI water nozzle 330 is removed from the annular cup 316. The wafer 324 is spun dry.

Figure 5E:
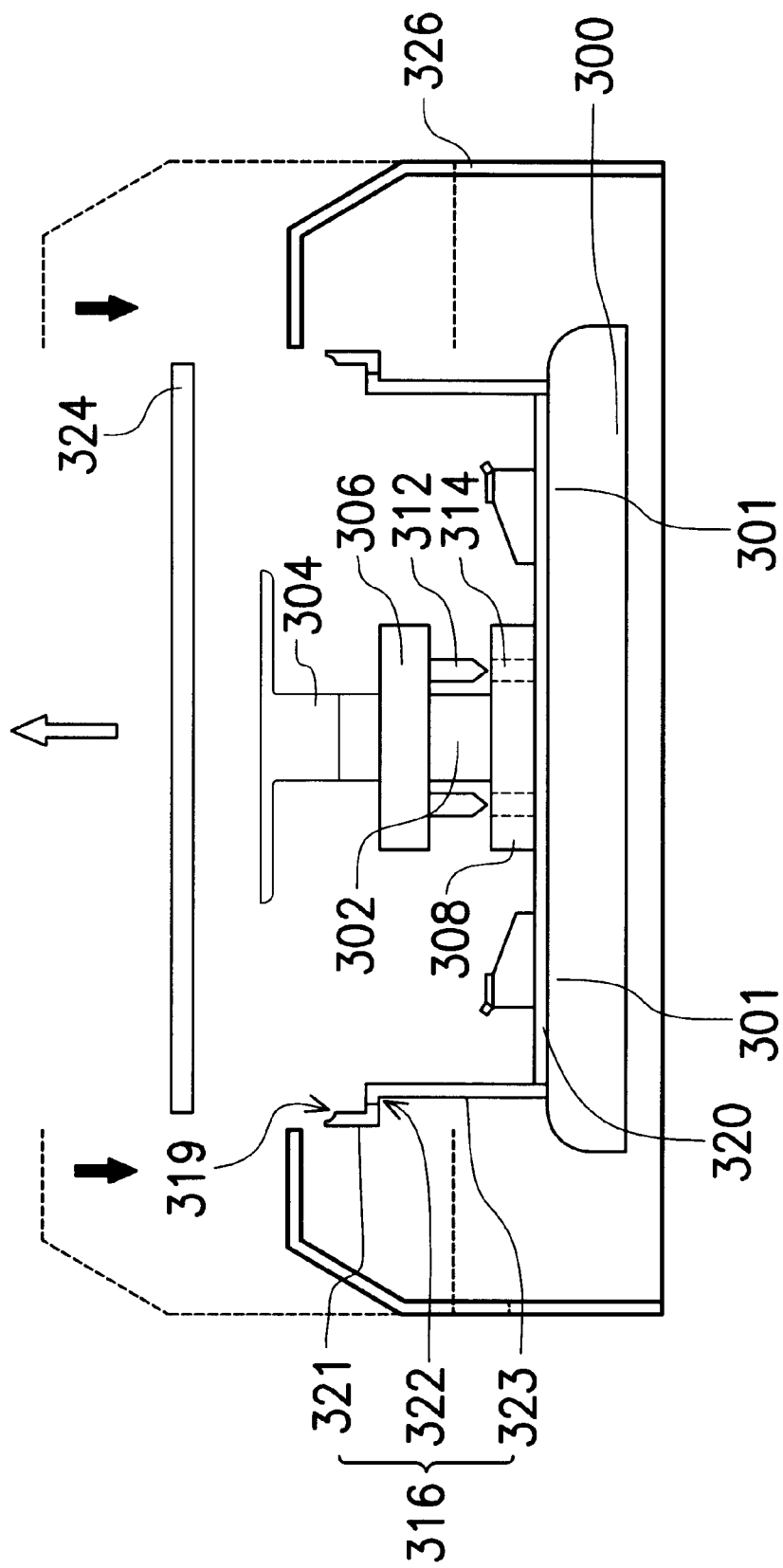

As shown in FIG. 5E, after spin drying, the wafer 324 is removed away from the developer unit and the external cup 326 is moved down to finish the development step.

The present invention includes the following advantages:

1. In the invention, the wafer is supported by the annular cup, so that the developer dose not flow to the underside of the wafer and the minimum developer required for performing the development step can be met by using any kind of developer nozzle. The minimum developer can uniformly cover the wafer because of the spinning wafer and the spinning annular cup.

2. In the invention, since the wafer is disposed on the bracket, the contaminate remaining on the underside of the wafer can be reduced.

3. In the invention, the inner wall of the annular cup can be washed by DI water sprayed from the underside rinse nozzles, so that the contaminate on the inner wall of the annular cup can be removed.

4. In the invention, because there is a tapered, bowed structure at the top of the upper wheel of the annular cup, the wafer can successfully slide to the proper location. Additionally, when the wafer does not slide to the proper location, the vacuum suction cannot attain the required condition and an abnormal operation signal warns an operator.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A developer cup, comprising:

a bed;

a central spindle, vertically and rotatably coupled to a center of the bed through an end of the central spindle;

a chuck, vertically coupled to an end of the central spindle opposite to the bed end;

an upper coupling, coupled to the central spindle between the chuck and the bed, wherein the chuck, the upper coupling and the bed are coaxial to each other and the chuck, the upper coupling and the bed coaxially and linearly move synchronously through the central spindle;

a lower coupling, moveably coupled to the central spindle between the upper coupling and the bed, wherein the upper coupling is separably coupled to the lower coupling; and an annular cup, having an upper wheel and a lower wheel, wherein the upper wheel is aligned with the lower wheel and the upper wheel is coupled to the lower wheel through a plurality of the brackets and the lower wheel is smaller than the upper wheel.

2. The developer cup of claim 1, wherein a top of the upper wheel has a tapered, bowed structure and a inner diameter of the upper wheel is similar to that of a wafer.

3. The developer cup of claim 1, wherein a wall of the upper wheel is higher than a thickness of a wafer.

4. The developer cup of claim 1, wherein when the upper coupling moves up with the chuck, and the upper coupling leaves the lower coupling.

5. The developer cup of claim 1, wherein when the upper coupling moves down with the chuck, the upper coupling wedges the lower coupling.

6. The developer cup of claim 5, wherein the upper coupling has a plurality of pins and the lower coupling has a plurality of holes which respectively correspond to the pins.

7. The developer cup of claim 5, wherein the upper coupling has a plurality of holes and the lower coupling has a plurality of pins which respectively correspond to the holes.

8. The developer cup of claim 1, wherein the upper coupling has a plurality of pins and the lower coupling has a plurality of holes which respectively correspond to the pins.

9. The developer cup of claim 8, wherein the pins includes plugs.

10. The developer cup of claim 8, wherein the pins include wedges.

11. The developer cup of claim 1, wherein the upper coupling has a plurality of holes and the lower coupling has a plurality of pins which respectively correspond to the holes.

12. The developer cup of claim 11, wherein the pins includes plugs.

13. The developer cup of claim 11, wherein the pins include wedges.

14. The developer cup of claim 1, wherein the bed has a plurality of underside rinse nozzles.

* * * * *